United States Patent [19]

Palaszewski

[11] Patent Number: 5,469,328
[45] Date of Patent: Nov. 21, 1995

[54] ELECTRONICS CABINET WITH REDUCED ABSORPTION OF SOLAR RADIATION

[75] Inventor: Stephen J. Palaszewski, Chester Township, Morris County, N.J.

[73] Assignee: AT&T Corp., Murray Hill, N.J.

[21] Appl. No.: 204,824

[22] Filed: Mar. 2, 1994

[51] Int. Cl.⁶ ........................................ H05K 7/20
[52] U.S. Cl. ................................................ 361/690
[58] Field of Search ........................ 361/688, 690, 361/692, 694, 697, 704, 707, 710–711, 724, 714; 429/96, 99, 100

[56] References Cited

U.S. PATENT DOCUMENTS 4,535,386  8/1985  Frey, Jr. et al. ............... 361/690
5,140,744  8/1992  Miller .
5,150,277  9/1992  Bainbridge et al. .

FOREIGN PATENT DOCUMENTS 0153997  10/1989  Japan .................................. 361/690

*Primary Examiner*—Gregory D. Thompson
*Attorney, Agent, or Firm*—Lester H. Birnbaum

[57] ABSTRACT

Disclosed is an electronics cabinet with a compartment for storing batteries and having heat shields for reducing heat buildup in the compartment. The heat shields are attached to each door of the compartment with an air gap therebetween so that absorbed solar heat can be removed by natural convection.

6 Claims, 2 Drawing Sheets

ELECTRONICS CABINET WITH REDUCED ABSORPTION OF SOLAR RADIATION

BACKGROUND OF THE INVENTION

This invention relates to cabinets for housing electronic equipment including batteries.

In telecommunications systems, such as digital loop carrier systems, it is necessary to house electronic equipment in outdoor cabinets situated near telephone subscribers. These cabinets also include batteries to provide backup power in the event of a power failure. When these cabinets are installed in areas of high temperatures, the batteries can swell due to thermal runaway and in extreme cases can generate sufficient hydrogen that an explosive mixture can be created in the cabinet.

It is desirable, therefore, to provide a cabinet with some means for reducing the temperature rise of the batteries.

SUMMARY OF THE INVENTION

The invention is a cabinet for housing electronic equipment and including a compartment for housing at least one battery. The compartment includes at least one door. Mounted to the door is a plate so that an air gap is formed between the plate and door of sufficient thickness to remove by natural convection, the heat absorbed by the plate due to solar radiation.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
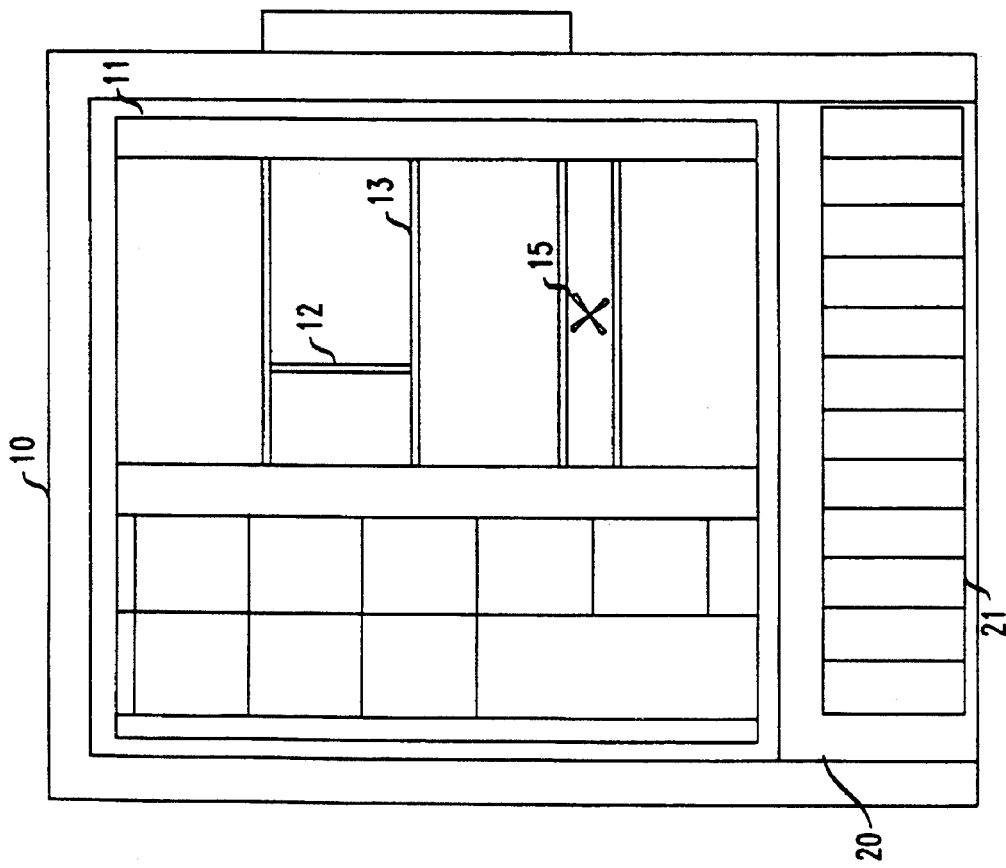
FIG. 1 is a front view of a cabinet in accordance with an embodiment of the invention.
Figure 2:
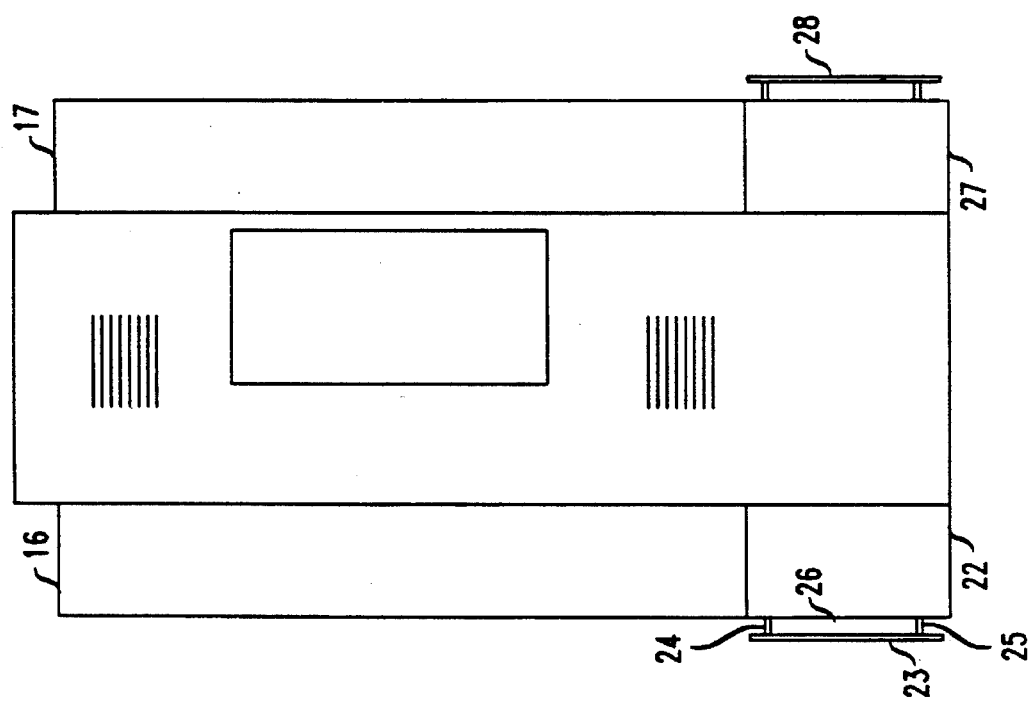
FIG. 2 is a side view of the cabinet in accordance with the same embodiment.

FIGS. 1 and 2 illustrate a typical example of an electronics cabinet 10 which includes the inventive features. (In FIG. 1, the doors have been removed to view the inside of the cabinet.) The cabinet includes an upper compartment 11 for housing electronic equipment such as circuit packs, e.g., 12, mounted within shelves, e.g., 13, to form banks of equipment. Such cabinets also typically include fans, e.g., 15, for cooling purposes. Door 16 on the front surface and door 17 on the rear surface provide access to equipment in the top compartment 11. (For a more detailed discussion of an electronics cabinet, see, e.g., U.S. Pat. No. 5,150,277 issued to Bainbridge et al., and incorporated by reference herein.)

A bottom compartment 20 is also provided which houses at least one battery 21 (but usually a plurality of batteries) coupled to the electronic equipment in the top compartment 11 through apertures, not shown, connecting the two compartments. The bottom compartment has a door 22 mounted on the front surface and a door 27 mounted on the rear surface (which doors are separate from the previously mentioned doors 16 and 17) for providing access to the batteries. The doors 22 and 27 are typically made of painted aluminum.

Mounted to each door, 22 and 27, is a plate, 23 and 28, made of a material, typically painted aluminum, which possesses good heat conductivity.

$$\left( \text{i.e. at least } 52 \frac{\text{watts}}{\text{meter deg C.}} \right).$$

The plates 23 and 28 typically cover essentially the entire surface of the doors 22 and 27. Each plate is mounted to a door by means of posts, e.g., 24 and 25, so that an air gap 26 is formed between the door and shield (see FIG. 2). The posts are typically aluminum rods which are screwed into the plate and door. The plates 23 and 28 typically have a thickness in the range 0.2–0.4 cm and the air gap has a thickness within the range 1.0–3.0 cm.

In operation, when the cabinet 10 is mounted outdoors, the sun's rays will be incident on the plate 23 or 28 rather than the door 22 or 27, causing the plate to heat up. The air gap, e.g., 26, acts like a duct which allows the heat thus generated to be carried away by the ambient air through natural convection. This action keeps the doors 22 or 27 cool, and thereby reduces heating of the batteries 21 within the compartment 20 by solar radiation.

The plates 23 and 28 are especially useful for reducing battery temperatures if the battery compartment doors are painted a dark color for aesthetic reasons, since more solar radiation is absorbed by dark colored surfaces than light colored surfaces.

Figure 3:
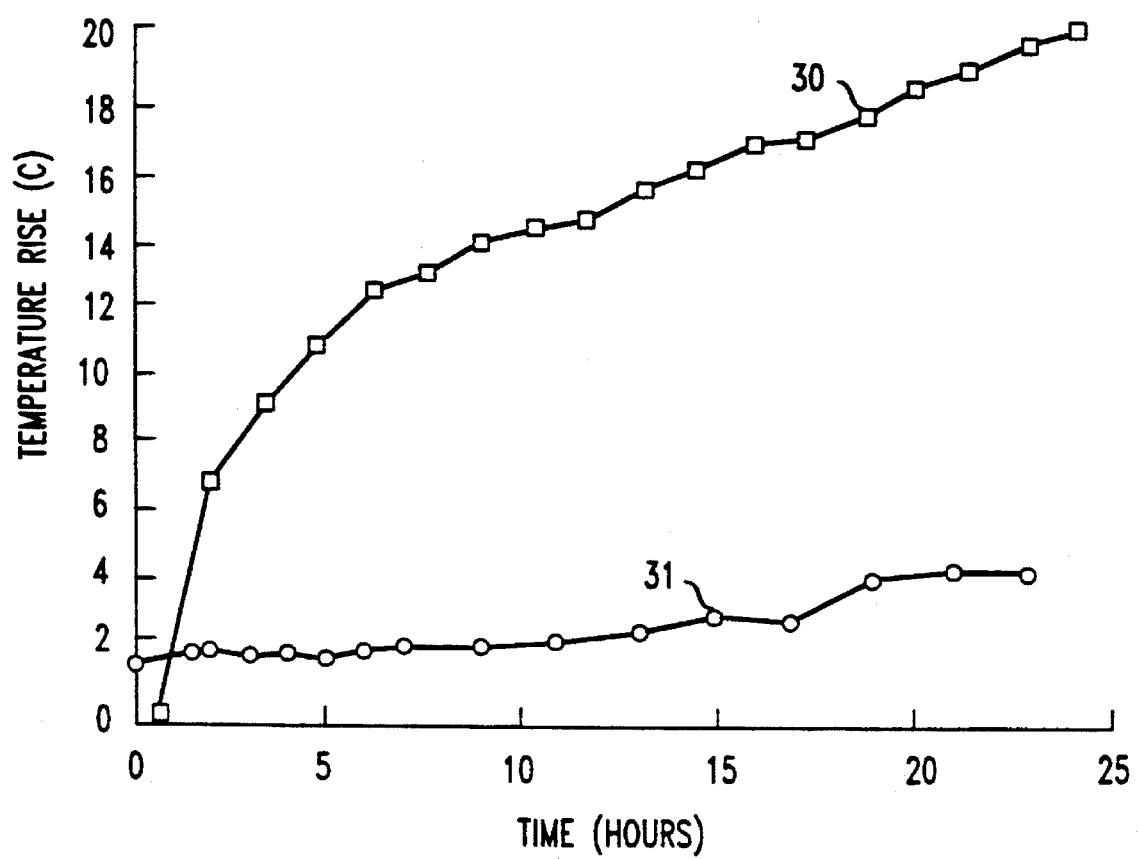
FIG. 3 is a graph of the temperature rise of a battery within a cabinet including the invention as compared to a prior art cabinet.

FIG. 3 illustrates the temperature rise of a battery within compartment 20 in the standard case of a brown painted door on the compartment (curve 30) as compared with the case of adding a brown painted plate in accordance with the invention (curve 31). In the experiment, heating pads were attached to the plate or door and powered by a variable AC voltage source. The power delivered by the source was calculated to simulate the amount of heat that the plate or door would absorb if the sun were incident thereon (in this case, 260 watts per plate).

It will be appreciated that after approximately 24 hours, the battery temperature in the case where a plate was used in accordance with the invention (curve 31) had a temperature which was approximately 15 degrees C less than the battery which included only a door (curve 30).

Various modifications of the invention will become apparent to those skilled in the art. All such variations which basically rely on the teachings through which the invention has advanced the art are properly considered within the scope of the invention.

I claim:

1. A cabinet for housing electronic equipment comprising:
   a compartment including at least one door, said compartment housing at least one battery; and
   a plate mounted to the door outside the compartment so as to form an air gap of sufficient thickness to remove by natural convection heat absorbed by the plate due to solar radiation, said plate comprising a material which has a heat conductivity of at least $$52 \frac{\text{watts}}{\text{meter deg } C.}.$$

2. The cabinet according to claim 1 wherein the air gap has a thickness in the range 1.0–3.0 cm.

3. The cabinet according to claim 1 wherein the plate covers essentially the entire surface of the door.

4. The cabinet according to claim 1 wherein the plate comprises painted aluminum.

5. The cabinet according to claim 1 wherein the plate has a thickness within the range 0.2–0.4 cm.

6. The cabinet according to claim 1 wherein the plate is mounted to the door by means of aluminum posts.

* * * * *